United States Patent
Michael et al.

(12)

(10) Patent No.: US 6,174,824 B1
(45) Date of Patent: Jan. 16, 2001

(54) POST-PROCESSING A COMPLETED SEMICONDUCTOR DEVICE

(75) Inventors: James George Michael, Burlington; Jeffrey Scott Miller, Colchester; Gary Dale Pittman, Charlotte; Rosemary Ann Previti-Kelly, Richmond, all of VT (US)

(73) Assignee: International Business Machines Corporation, Armonk, NY (US)

( * ) Notice: Under 35 U.S.C. 154(b), the term of this patent shall be extended for 0 days.

(21) Appl. No.: 09/262,110

(22) Filed: Mar. 4, 1999

(51) Int. Cl.[7] .......................... H01L 21/31; H01L 21/469
(52) U.S. Cl. ................................................ 438/778
(58) Field of Search .................................. 438/778, 780, 438/786, 787, 791, 761, 762, 623, 488, 564

(56) References Cited

U.S. PATENT DOCUMENTS

| | | | |
|---|---|---|---|
| 4,746,622 | 5/1988 | Hawkins et al. | 437/26 |
| 4,766,089 | 8/1988 | Davids et al. | 437/53 |
| 5,110,712 | 5/1992 | Kessler et al. | 430/312 |
| 5,134,083 | 7/1992 | Matthews | 437/40 |
| 5,386,382 | 1/1995 | Ahn | 365/174 |
| 5,563,102 | * 10/1996 | Michael | 437/209 |
| 5,663,079 | 9/1997 | Blanchard | 438/138 |
| 5,700,739 | 12/1997 | Chiang et al. | 438/655 |
| 5,976,710 | * 11/1999 | Sachdev et al. | 428/620 |

* cited by examiner

Primary Examiner—Matthew Smith
Assistant Examiner—Calvin Lee
(74) Attorney, Agent, or Firm—Heslin & Rothenberg, P.C.

(57) ABSTRACT

A technique for post-processing a conventionally completed semiconductor device having a final passivation layer and bond pads exposed through the final passivation layer. The technique includes forming a protective film over the final passivation layer and exposed bond pads of the semiconductor device, and thereafter performing post-processing of the completed semiconductor device. Post-process structures, such as charge-coupled devices, can be formed above the protective film during this post-processing. Subsequent to the post-processing, the protective film is selectively etched to again expose the bond pads.

8 Claims, 3 Drawing Sheets

POST-PROCESSING A COMPLETED SEMICONDUCTOR DEVICE

TECHNICAL FIELD

The present invention relates generally to methods for fabricating semiconductor devices, and more particularly, to a technique for post-processing a completed semiconductor wafer or device.

BACKGROUND OF THE INVENTION

Integrated circuit device chips are typically fabricated from semiconductor substrates upon whose surfaces are formed resistors, transistors, diodes and other electrical circuit elements. These electrical circuit elements are connected to one another through patterned conductor layers which are separated by insulator layers. These patterned conductor layers are referred to as metal layers or levels.

Conventionally, once the interconnecting metal layers are formed, a last metal layer is defined comprising bond pads or connection pads for access to the lower metal layers and the integrated circuitry of the device, which may comprise a plurality of discrete integrated circuit die or chips to be diced from the wafer. A final passivation layer is then applied over the entire surface and selectively etched to expose the bond pads to allow electrical connection to the integrated circuitry of the completed device via the metal levels.

SUMMARY OF THE INVENTION

Advantageously, applicants have recognized and disclose herein the desirability of performing further processing above the final passivation layer of the completed semiconductor device. For example, as one application, it may be desirable to form devices, such as charge-coupled devices (hereinafter also referred to as "CCDs") above the final passivation layer, thereby integrating the CCDs with the semiconductor device or wafer. However, fabrication of such an integrated structure exposes the final passivation layer and more importantly, the uncovered bond pads of the semiconductor device to the chemicals and processes needed to form the post-process structures. For example, during color patterning of a CCD device being formed above the final passivation layer, the color patterning process used to develop out the photoresist could result in base/acid attack of the exposed bond pads.

The present invention is directed to facilitating post-processing above the upper surface of a conventionally fabricated and otherwise completed semiconductor device.

Briefly summarized, the invention comprises in one aspect a method for processing a semiconductor device. The method includes: providing the semiconductor device with at least one metal level, a final passivation layer protecting the at least one metal level, and bond pads exposed through the final passivation layer for accessing the semiconductor device via the at least one metal level; forming a protective film over the final passivation layer and the exposed bond pads of the semiconductor device, thereby providing a semiconductor device assembly; after forming the protective film, performing post-processing of the semiconductor device assembly; and subsequent to the post-processing, selectively etching the protective film to expose the bond pads.

In another aspect, the invention comprises a semiconductor device assembly which includes a conventional completed semiconductor device with at least one metal level, a final passivation layer protecting the at least one metal level and bond pads exposed through the final passivation layer for accessing the semiconductor device via the at least one metal level. The assembly includes a protective film over the final passivation layer, the protective film having openings aligned with the exposed bond pads of the semiconductor device to allow access thereto. A post-process structure is disposed above the protective film, having been formed above the protective film subsequent to completion of formation of the conventional semiconductor device with the at least one metal level, final passivation layer and exposed bond pads.

To restate, applicants disclose herein the desirability of performing "post-processing" above the final passivation layer of a completed semiconductor device or wafer, e.g., to integrate one or more additional structures with the semiconductor device. To accomplish this, a protective film is formed over the final passivation layer and exposed bond pads of the semiconductor device. This protective film delivers bond pad protection post final passivation formation and etching. The process disclosed herein is compatible with further semiconductor processing, and no special tools or process steps are required to implement the technique. Once in place, the protective film protects the otherwise exposed bond pads from moisture and metallic migration, such as ionics. Disclosed herein is a low-cost, fast throughput film deposition process for the formation of the protective film. The wafer temperature for formation of the film is compatible with back end of line thermal processing/budgeting. A robust process window for film deposition is available with negligible surface charging effects. For example, the protective film can be formed at a few Torr and 1.0 Kw of power.

BRIEF DESCRIPTION OF THE DRAWINGS

The above-described objects, advantages and features of the present invention, as well as others, will be more readily understood from the following detailed description of certain preferred embodiments of the invention, when considered in conjunction with the accompanying drawings in which.

BEST MODE FOR CARRYING OUT THE INVENTION

In an effort to continue to integrate devices, applicants have discovered the desirability of conducting post-processing on the upper surface of a conventionally fabricated semiconductor device, such as a semiconductor wafer having integrated circuitry formed thereon with traditional metal levels or layers in place above the integrated circuitry and connect pads exposed through a final passivation layer. However, one problem encountered in performing this post-processing is the degrading effect on the final passivation layer and exposed contact pads from the chemicals and processings employed in the post-processing, such as those needed to create desired post-process structures. As used herein, the term "post-process" refers to processing to be performed subsequent to fabrication of a completed semiconductor wafer (also referred to herein as a semiconductor device), which is otherwise ready for dicing of the individual integrated circuit chips defined therein for mounting into a package that makes electrical contact to the integrated circuits through the contact pads.

Figure 1:
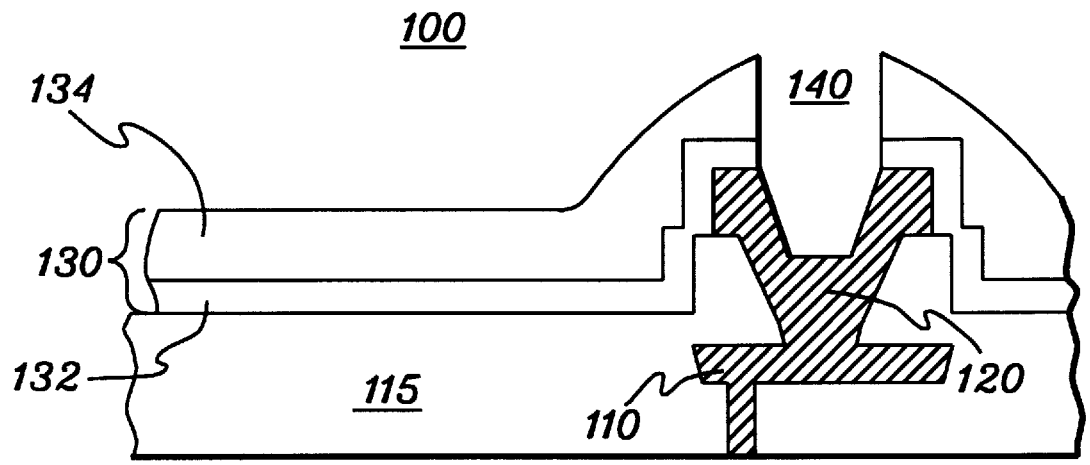
FIG. 1 is a partial cross-sectional view of one embodiment of a conventionally fabricated, completed semiconductor device 100 showing the upper metal layers and final passivation layers with the bond pads exposed therethrough.

FIG. 1 depicts one partial embodiment of the upper surface of a final semiconductor device, generally denoted 100, to undergo processing in accordance with the principles of the present invention. Shown in FIG. 1 is a next to last metal level 110 conventionally defined within an insulative material layer 115, and a last metal layer comprising bond pads 120 which electrically connect to the next to last metal level 110. Metal level 110 connects to further metal levels (not shown) of the semiconductor device for indirect connection to the integrated circuitry of the semiconductor device. Alternatively, metal level 110 may connect directly to integrated circuitry of the device. A final passivation layer 130 is disposed over the upper surface of semiconductor device 100 and selectively etched to form openings 140 exposing bond pads 120. As one example, final passivation layer 130 could comprise a multi-layer sandwich, such as a nitride layer 132 and a polyimide layer 134.

As noted, applicants have discovered the desirability of performing further processing, herein referred to as "post-processing", to add additional structures above the final passivation layer of semiconductor device 100, which in one embodiment comprises a semiconductor wafer with a plurality of conventionally fabricated semiconductor chips defined therein. By way of example, multiple colored resist or filters of a charge-coupled device may be added above the final passivation layer for integration with one or more of the chips of the semiconductor wafer. Fabrication of CCDs above the completed semiconductor device or wafer includes in one embodiment formation of red filters, blue filters and green filters which may involve color processing employing bases and/or acids that may be damaging to the final passivation layer, or more likely, the exposed bond pads of the otherwise finished semiconductor device.

Figure 2:
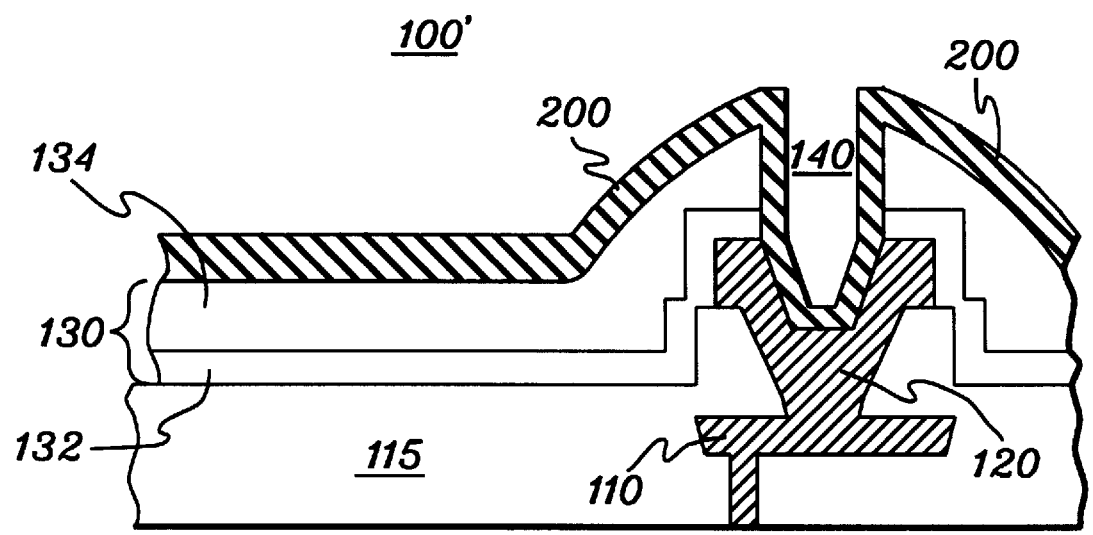
FIG. 2 is a cross-sectional view of the semiconductor device of FIG. 1 showing a protective film 200 formed over the upper surface of the final passivation layer and exposed bond pads, in accordance with the principles of the present invention, to facilitate post-processing above the semiconductor device 100.

FIG. 2 presents applicants' solution to the problem wherein a protective film 200 is overlaid above the final passivation layer and the exposed bond pads of the completed device prior to any post-processing of the semiconductor device 100. This protective film may either comprise a single layer or multiple layers and may comprise a variety of materials depending upon the post-processing application. For example, an oxide, a nitride or an oxide/nitride sandwich have been tested and are detailed below. Other films, however, could be used separately or in combination with silicon dioxide or silicon nitride. These films would include spun on glass, flowable oxides, fluorinated oxides, photosensitive polyimides, and other materials that (a) are substantially impermeable to the materials used in the post processing application, and (b) can be removed without substantial removal of the underlaying contact pads.

Figure 3:
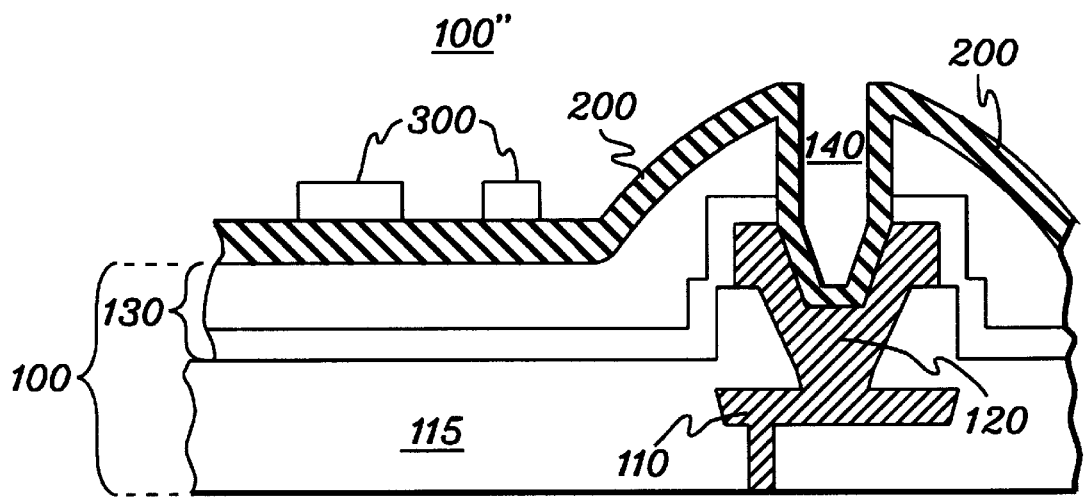
FIG. 3 is a cross-sectional view of the semiconductor device and protective film assembly 100' of FIG. 2 wherein post-process structures 300 have been formed above the protective film 200 in accordance with the principles of the present invention.

FIG. 3 depicts an assembly 100" comprising the assembly 100' of FIG. 2 with post-process structures 300 formed on the upper surface of protective film 200. As noted above, in one example post-process structures 300 may comprise color patterned filters for one or more charge-coupled devices to be integrated with one or more chips of the underlying semiconductor device or wafer. However, the present invention is not limited to this particular implementation and may be employed with any post-process fabrication process, or even with post-processing failure analysis such as edge seal analysis which in one embodiment may use fuming nitric acid.

Figure 4:
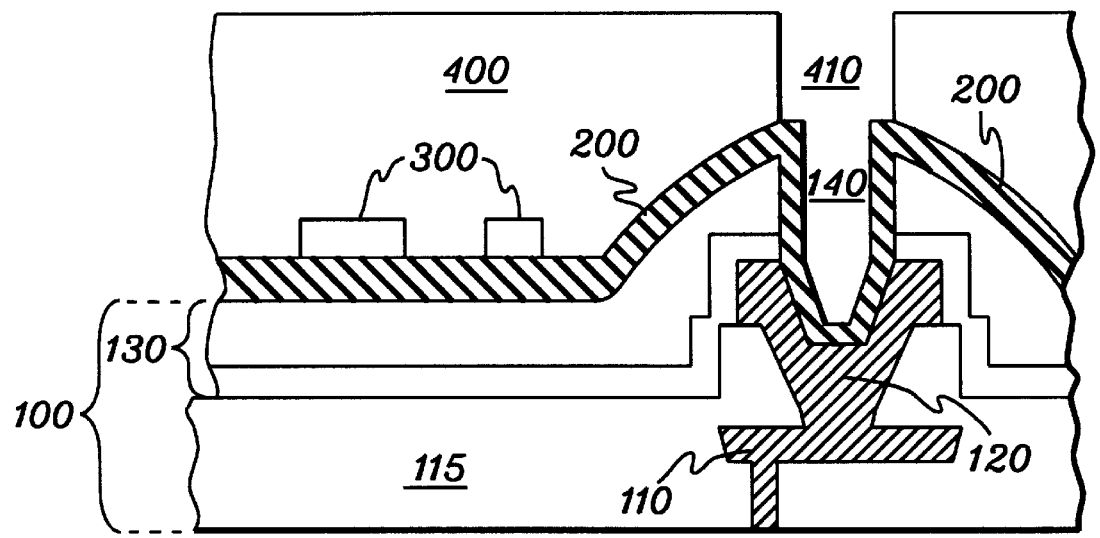
FIG. 4 is a cross-sectional view of the semiconductor device, protective film, and post-process structures of FIG. 3 wherein a photo-resist has been deposited and selectively etched to expose the protective film above the semiconductor device's contact pads.
Figure 5:
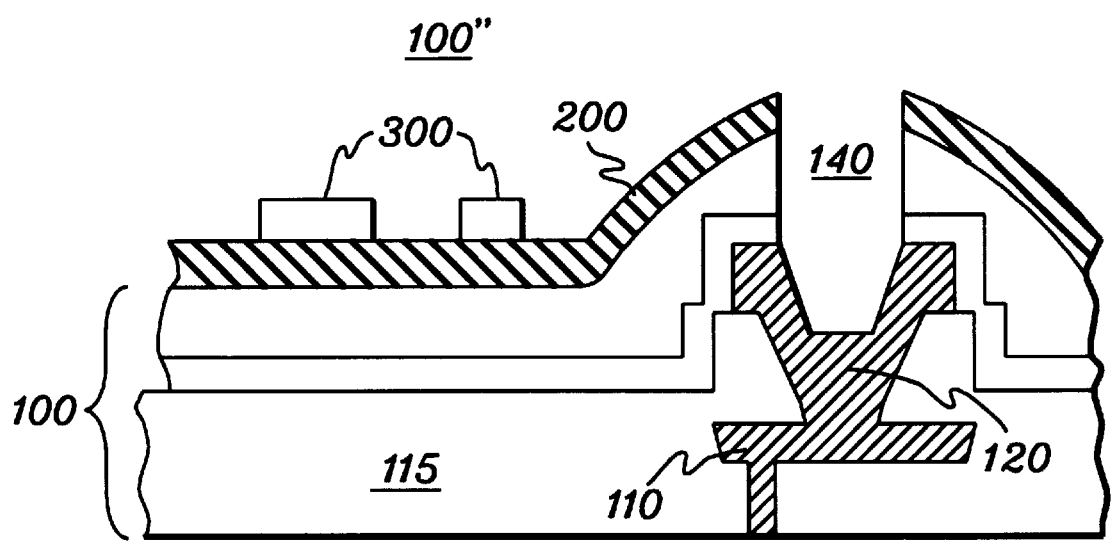
FIG. 5 is a cross-sectional view of the semiconductor device assembly of FIG. 4, wherein the protective film has been etched away above the bond pads of the semiconductor device 100 and the photo-resist employed in patterning and etching the protective film has been removed, leaving the post-process structures residing on the semiconductor device and the bond pads exposed for wire bond connection thereto.

FIG. 4 depicts the assembly of FIG. 3 after a photoresist has been applied, patterned and etched to expose 410 protective film 200 in opening 140 over bond pads 120 of device 100. After etching protective film 200 within opening 140, the photoresist 400 is stripped from the assembly leaving the final structure of FIG. 5.

Various specific process examples are next presented for establishing protective film 200. In these examples, it is assumed that final passivation layer 130 comprises an upper layer of polyimide 134 as depicted in FIG. 1. Given this, applicants have discovered that polyimide layer 134 should be cured to 400° C. for at least 30 minutes when a protective film of silicon oxide, silicon nitride, or oxide/nitride is employed as film 200. As one example, the protective film could comprise silicon oxide over polyimide deposited to 4500 Å. After post-processing the chip, this protective film of oxide is photo patterned to expose the last metal level containing the bonding pads 120. The exposed oxide is then etched to uncover the bond pads.

As another example, the protective film 200 may comprise a nitride layer over polyimide 134. Again, it is assumed that the polyimide is cured to 400° C. for at least 30 minutes. Nitride is deposited to 5200 Å, after which post-processing occurs. The nitride is then photo patterned to expose the last or uppermost metal layer of the semiconductor device for bonding, and etched to uncover the bond pads.

As a further example, the protective film might comprise a sandwich of oxide and nitride disposed over the final polyimide passivation layer. In one example, 4500 Å of oxide could be deposited, followed by 5200 Å of nitride. Alternatively, a thinner protective film might comprise 2000 Å of oxide disposed over the polyimide 134 and 2300 Å of nitride formed over the oxide. The oxide/nitride film is then photo patterned, and the nitride is etched, followed by the oxide to expose the underlying bond pads.

One recipe for silane-based oxide using a wafer processing tool, such as the Novellus Concept 1 PECVD tool offered by Novellus System, Inc. of San Jose, Calif., would use flows of $SiH_4$ of 0.300 liters/minute, $N_2$ 1.5 l/m, $N_2O$ 9.5 l/m and cathodes HF 1.5 kw and LF 0 kw, with a pressure of 2.4 T and temperature 400° C. The deposition rate would be 5000 angstroms/minute. For nitride formation as a protective film, 400° C. might be employed with a pressure of 2.4 T (range from 2.1 to 2.6 T). Gas flows might be $NH_3$ at 300 sccm, $SiH_4$ at 300 sccm and $N_2$ at 1.5 liters/minute. Thickness can be controlled by varying the gas flow. Note that using other wafer processing tools, a process at 300° C. is also possible for PAETE polyimide, which is its cure temperature as well.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method for processing a semiconductor device comprising:
   (i) providing said semiconductor device with at least one metal level, a final passivation layer protecting said at least one metal level and bond pads exposed through said final passivation layer for accessing said semiconductor device via said at least one metal level;
   (ii) forming a protective film over said final passivation layer and said exposed bond pads of said semiconductor device, thereby providing a semiconductor device assembly;
   (iii) after forming said protective film, performing post-processing of said semiconductor device assembly; and
   (iv) subsequent to said post-processing, selectively etching said protective film to expose said bond pads.

2. The method of claim 1, wherein said final passivation layer comprises polyimide, and wherein said step of providing said final passivation layer comprises curing said polyimide at at least 400° C. for at least 30 minutes.

3. The method of claim 1, wherein said protective film is substantially impermeable to materials utilized in said stop of providing post-processing.

4. The method of claim 3, wherein said protective film comprises at least one of an oxide, nitride, oxide nitride sandwich, spun on glass, flowable oxide, fluorinated oxide, photosensitive polyimide, silicon dioxide and silicon nitride.

5. The method of claim 1, wherein said step of performing post-processing (iii) comprises forming post-process structures above said final passivation layer of said semiconductor device assembly.

6. The method of claim 5, wherein said post-process structures comprise a CCD device, and wherein said post-processing comprises performing color patterning for said CCD device above said protective film.

7. The method of claim 5, wherein subsequent to formation of said post-process structures, said method comprises applying a photoresist, patterning the photoresist to expose regions of said protective film above said bond pads, etching said protective film within said regions above said bond pads to expose said bond pads, and removing said photoresist.

8. The method of claim 1, wherein said post-processing (iii) comprises performing edge seal failure analysis of said semiconductor device assembly.

\* \* \* \* \*